(12) United States Patent
Takahashi

(10) Patent No.: US 6,253,358 B1
(45) Date of Patent: Jun. 26, 2001

(54) METHOD FOR SUPPORTING THE DESIGN OF SEMICONDUCTOR INTEGRATED CIRCUIT AND SYSTEM USING THE SAME METHOD

(75) Inventor: Shuji Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/056,863

(22) Filed: Apr. 8, 1998

(30) Foreign Application Priority Data

Apr. 9, 1997 (JP) .................................................. 9-090406

(51) Int. Cl.$^7$ ...................................................... G06F 17/50
(52) U.S. Cl. .................................. 716/6; 716/11; 716/18
(58) Field of Search ........................ 395/500.02–500.19; 716/1–21

(56) References Cited

U.S. PATENT DOCUMENTS

| | | | |
|---|---|---|---|
| 5,235,521 | * 8/1993 | Johnson et al. | 716/6 |
| 5,610,833 | * 3/1997 | Chang et al. | 716/11 |
| 5,623,418 | * 4/1997 | Rostoker et al. | 716/1 |
| 5,648,913 | * 7/1997 | Bennett et al. | 716/6 |
| 5,692,160 | * 11/1997 | Sarin | 703/23 |

(List continued on next page.)

FOREIGN PATENT DOCUMENTS

| | | | |
|---|---|---|---|
| 637184 | 2/1994 | (JP) | H01L/21/82 |
| 77142 | 1/1995 | (JP) | H01L/27/118 |
| 7262264 | 10/1995 | (JP) | G06F/17/50 |
| 7263560 | 10/1995 | (JP) | H01L/21/82 |
| 877227 | 3/1996 | (JP) | G06F/17/50 |
| 877243 | 3/1996 | (JP) | G06F/17/50 |

OTHER PUBLICATIONS

Pant et al. ("Device–circuit Optimization For Minimal Energy And Power Consumption In CMOS Random Logic Networks", Proceedings of the 34th Design Automation Conference, Jun. 9, 1997, pp. 403–408).*

Shen et al. ("CB–Power: a hierarchical cell–based power characterization and estimation environment for static CMOS circuits", Proceedings of the ASP–DAC '97, Asia and South Pacific Design Automation Conference, pp. 189–194, Jan. 1, 1997).*

Tsui et al. ("Efficient estimation of dynamic power consumption under a real delay model", Proceeding of the 1993 IEEE/ACM International Conference on Computer–Aided Design, pp. 224–228, Jan. 1, 1993).*

(List continued on next page.)

*Primary Examiner*—Matthew Smith
*Assistant Examiner*—Phallaka Kik
(74) *Attorney, Agent, or Firm*—Sughrue, Mion, Zinn, Macpeak & Seas, PLLC

(57) ABSTRACT

An overall calculation of a semiconductor integrated circuit comprising an assemblage of a plurality of circuit blocks is predicted at an initial stage of design.

When a circuit block is selected by clicking an analysis button on the screen of the system analysis browser, the block is changed to the screen of the circuit block analysis browser for the selected circuit block. When a parameter unique to the circuit is input to the parameter input panel to click the start button, the performance prediction value of the circuit is displayed on the parameter input panel. This is performed for each circuit block. On the data format panel of the system analysis browser screen, the prediction of the wiring delay time between respective circuits is displayed together with the performance prediction value of each circuit block.

19 Claims, 10 Drawing Sheets

U.S. PATENT DOCUMENTS

| | | | | |
|---|---|---|---|---|
| 5,740,347 | * | 4/1998 | Avidan | 714/33 |
| 5,774,371 | * | 6/1998 | Kawakami | 716/10 |
| 5,883,808 | * | 3/1999 | Kawarabayashi | 716/2 |
| 5,912,820 | * | 6/1999 | Kerzman et al. | 716/6 |
| 5,963,730 | * | 10/1999 | Toyonaga et al. | 395/500.09 |
| 5,974,245 | * | 10/1999 | Li et al. | 716/10 |

OTHER PUBLICATIONS

Borah et al. ("Transistor sizing for low power CMOS circuits", IEEE Transactions on Computer–Aided Design of Integrated Circuits and Systems, vol. 15, No. 6, pp. 665–671, Jun. 1, 1996).*

Chaiyakul et al. ("Timing models for high–level synthesis", Design Automation Conference, 1992, EURO–VHDL '92, EURO–DAC '92, Sep. 7, 1992, pp. 60–65).*

Burkis ("Clock tree synthesis for high performance ASICs", Proceedings of Fourth Annual IEEE International ASIC Conference and Exhibit, 1991, pp. P9–8/1–3, Sep. 23, 1991).*

H. B. Bakoglu, "A System Level Circuit Model for Multi– and Single Chip CPUs," ISSCC 1987, pp. 308–309, 439–440, Jan. 1987.

* cited by examiner

FIG.9

| 0.35 μm RULE ▼ |
|---|
| 0.35 μm RULE |
| 0.25 μm RULE |
| 0.18 μm RULE |
| 0.13 μm RULE |
| 0.10 μm RULE |

FIG.10

| RISC core ▼ |
|---|
| CISC core |
| DSP core |
| Gate Array |
| SRAM |

FIG.11 cpucore_cmosℓℓ.bra

| VDD | VTH | Lg | Wg/Lg | tgox | nw | pw | ew | Rint | Cint | rℓ | Ng··· |
|---|---|---|---|---|---|---|---|---|---|---|---|
| 1.5 | 0.3 | 0.13 | 5 | 4.5 | 6 | 0.4 | 0.5 | 0.44 | 0.21 | 1 | 5e7··· |

FIG.12

MMP_LO13.syi

|  | Dc | fc | Pc |
|---|---|---|---|
| 1:cpucore_cmosℓℓ.bra | 5.5 | 500 | 6.5 |
| 2:DSP_LO13A.bra | 7.7 | 450 | 2.0 |
| 3:Cacheℓ_LO13S.bra | 12.2 | 220 | 0.5 |

|  | 1 | 2 | 3 |
|---|---|---|---|
| 1 | – | 210 | 350 |
| 2 | 210 | – | 150 |
| 3 | 350 | 150 | – |

FIG.13

MMP_LO13.syp

|   | Dc | fc | Pc |
|---|---|---|---|
| 1:cpucore_cmosℓℓ.bra | 5.5 | 500 | 6.5 |
| 2:DSP_LO13A.bra | 7.7 | 450 | 2.0 |
| 3:Cacheℓ_LO13S.bra | 12.2 | 220 | 0.5 |

|   | 1 | 2 | 3 |
|---|---|---|---|
| 1 | — | 210 | 350 |
| 2 | 210 | — | 150 |
| 3 | 350 | 150 | — |

1:cpucore_cmosℓℓ.bra

| $V_{DD}$ | $V_{TH}$ | $L_g$ | $W_g/L_g$ | tgox | $n_w$ | $p_w$ | $e_w$ | Rint | Cint | $r\ell$ | $N_g$ |
|---|---|---|---|---|---|---|---|---|---|---|---|
| 1.5 | 0.3 | 0.13 | 5 | 4.5 | 6 | 0.4 | 0.5 | 0.44 | 0.21 | 1 | 2e7 |

2:DSP_LO13A.bra

| $V_{DD}$ | $V_{TH}$ | $L_g$ | $W_g/L_g$ | tgox | $n_w$ | $p_w$ | $e_w$ | Rint | Cint | $r\ell$ | $N_g$ |
|---|---|---|---|---|---|---|---|---|---|---|---|
| 1.5 | 0.3 | 0.13 | 10 | 4.5 | 6 | 0.45 | 0.4 | 0.44 | 0.21 | 1 | 2e6 |

3:Cacheℓ_LO13S.bra

| $V_{DD}$ | $V_{TH}$ | $L_g$ | $W_g/L_g$ | tgox | $n_w$ | $p_w$ | $e_w$ | Rint | Cint | $r\ell$ | $N_g$ |
|---|---|---|---|---|---|---|---|---|---|---|---|
| 1.5 | 0.3 | 0.13 | 4 | 4.5 | 6 | 0.35 | 0.6 | 0.44 | 0.21 | 1 | 5e6 |

METHOD FOR SUPPORTING THE DESIGN OF SEMICONDUCTOR INTEGRATED CIRCUIT AND SYSTEM USING THE SAME METHOD

BACKGROUND OF THE INVENTION

1. Field of the Invention

The present invention relates to a method for supporting the design of a semiconductor integrated circuit and a system using the same method and, more particularly, to a method for supporting the design of the semiconductor integrated circuit for the prediction of the performance of a large-scale integrated circuit (LSI) and a system using the same method.

2. Description of the Prior Art

With the increase in the size of semiconductor integrated circuits (LSIs), time required for design has become so long that it is necessary to predict LSI performance at the earliest possible stage. Despite such requirements, as a result of higher transistor element performance due to a request for using it under the condition of higher frequency, however, the performance of the LSI largely depends on wiring delay, which means that LSI performance cannot be calculated until the very late stage of laying out the wiring.

A method proposed for calculating LSI performance, is the (Stanford University System Performance Simulator) (SUSPENS) model (H. B. Bakogulu et Al. ISSCC'87, pp. 308–309, 439–440, 1987). With this model, LSI performance as a whole is estimated with one estimate from technology parameter and circuit parameters.

Furthermore, this technology is disclosed in Japanese Patent Laid-Open No. 7-7142, Japanese Patent Laid-Open No. 8-77243, Japanese Patent Laid-Open No. 8-77227, Japanese Patent Laid-Open No. 7-262264, Japanese Patent Laid-Open No. 7-263560, and Japanese Patent Laid-Open No. 6-37184.

In the technology disclosed in Japanese Patent Laid-Open No. 7-7142, delay time is calculated from a logical description, the most appropriate value of the physical wiring configuration of a transistor is calculated by using the delay time, and then wiring is laid out on the layout of the cell base from this calculation result.

The technology disclosed in Japanese Patent Laid-Open No. 8-77243 is such that an effective wiring length is determined from a delay value for capacity load and a delay value for sufficiently long wiring. The precision of calculating the load capacity that is connected to the logic gate is improved by using this efficient wiring length, and the precision of the calculation of the delay value is improved.

In the technology disclosed in Japanese Patent Laid-Open No. 8-77227, processing for reducing clock skew is easily automated by differentiating the length of clock signal wiring for a cell that requires the clock signal, and registering, beforehand, a plurality of cells having different times for delaying the clock signal.

In the technology disclosed in Japanese Patent Laid-Open No. 7-262264, a comprehensive appropriation is attempted by simultaneously dividing logic cells that conflict while holding divided information.

In the technology disclosed in Japanese Patent Laid-Open No. 7-263560, an appropriate input/output buffer is selected based on semiconductor integrated circuit specifications, and the power consumed by the semiconductor integrated circuit is reduced and the chip area is decreased so that a semiconductor integrated circuit having high area efficiency can be designed.

In the technology disclosed in Japanese Patent Laid-Open No. 6-37184, specification data is input; a design is laid out based on data; channel usage efficiency, chip size, signal delay value, and capacity are calculated based on the layout design; and it is judged whether or not the calculation result satisfies the required specification so that evaluation precision at the initial stage of semiconductor integrated circuit design is improved.

In the SUSPENS model, however, since $R_{int} \times C_{int} \times D_c^2/2$ is assumed as the clock skew value (refer to the document on the SUSPENS model, p440, Table 2, Step 8), calculation is not satisfied for a detailed LSI following the 0.35 $\mu$m rule, in which the ratio of wiring delay is increased. When, for example, the 0.35 $\mu$m rule is applied, a 15 mm angle chip, a wiring resistance of 0.125 $\Omega/\mu$m, a wiring capacity of 0.17 fF/$\mu$m (wiring width of 0.4 $\mu$m, wiring pitch of 1 $\mu$m, wiring film thickness of 0.6 $\mu$m, and interlayer film thickness of 1 $\mu$m) are assumed, and $0.125 \times 0.17 \times 10^{-15}{}_x (15 \times 10^3)^2/2 = 2.4$ nsec. is calculated, but in actuality, the value is about 200 psec. so the calculation differs by one digit. In other words, the calculation value is about 10 times the actual value.

Furthermore, in the SUSPENS model, Lenz's index p is used, which is said to depend on the circuit architecture. With an increase in the scale of the LSI, however, for example, a different architecture circuit block, a CPU core, a first cache memory, and a second cache memory are provided on one chip so that the conventional Lenz's index cannot be used for the change in such architecture.

This is because, in the end, the SUSPENS model evaluates the circuit performance as a whole, in principle, so that the performance thereof cannot be evaluated in a case in which the circuit structure is changed.

Even when Lenz's index is defined for a new architecture, if the integration of the LSI is advanced, and then a different circuit block is mounted on the same chip, a new Lenz's index must be determined again. In other words, as long as the SUSPENS model is used, it is very difficult to predict the performance of the LSI in the new architecture.

In other words, even when the SUSPENS model is used for design, the operating frequency, chip area, and consumed power of the whole LSI to be designed are calculated, and it is judged whether or not the design satisfies the specification, and no effective information is provided on what aspects should be changed with respect to the change of the design.

Furthermore, the technology disclosed in each of the aforementioned publications is associated with the technology for the performance calculation of the circuit block. No technology is provided for predicting the overall calculation of the semiconductor integrated circuit comprising a combination of a plurality of circuit block at an initial stage of the design.

BRIEF SUMMARY OF THE INVENTION

An object of the present invention is therefore to provide a method for supporting design for a semiconductor integrated circuit and a system using the same method wherein an overall calculation of the semiconductor integrated circuit comprising a combination of a plurality of circuit blocks can be predicted at the initial stage of the design, and the prediction can be conducted by remote control via a communication circuit.

To solve the aforementioned problem, the present invention provides a method for supporting design of the semiconductor integrated circuit comprising an assemblage of a plurality of circuit blocks, the method comprising the steps of:

inputting a technology parameter and wiring material constituting each circuit for each circuit block;

inputting a circuit parameter for determining a circuit scale of each circuit block;

inputting a clock parameter for a clock buffer that is inserted into a transmission line between the clock supply source and each circuit block for receiving the clock supply;

and a process of performing at least one of the prediction of the clock skew of each circuit block, size of each circuit block, an operating frequency and consumed power by using parameters input in each steps.

Another aspect of the present invention provides a design support system of a semiconductor integrated circuit comprising a combination of a plurality of circuit blocks, the system comprising:

means for inputting a technology parameter concerning a positive element and wiring material constituting each circuit for each circuit block;

means for inputting a circuit parameter for determining a circuit scale of each circuit block;

means for inputting a clock parameter for a clock buffer that is inserted into a transmission line between a clock supply source and respective circuit block which receives the clock supply; and means for performing at least one of the following processes; prediction of the clock skew of each circuit block, the size of each circuit block, operating frequency and consumed power.

According to these two inventions, the prediction of the clock skew, the size of each circuit block, the operating frequency and consumed power can be performed by inputting the technology parameter, the circuit parameter, and the clock parameter.

BRIEF DESCRIPTION OF THE DRAWINGS

FIG. 9 is a structure view showing one example of a pop-up list display screen of the system;

FIG. 10 is a structure view showing one example of a pop-up list display screen of the system;

FIG. 11 is a structure view of a display screen of one part of one example of a circuit analysis data of the system;

FIG. 12 is a structure view of a display screen of a part of one example of system analysis data free from circuit analysis data of the system;

FIG. 13 is a structure view of a display screen of a part of one example of system analysis data attached with circuit analysis data of the system;

DETAILED DESCRIPTION OF THE PREFERRED EMBODIMENTS

Next, an embodiment of the present invention will be explained by referring to the accompanying drawings.

Firstly, the present invention provides a new model of a clock skew. The clock skew refers to a phase shift between clock signals that are transmitted to the circuits that require the clock signal. Since this model assumes the distribution of the clock pulse using a plurality of steps of clock buffers, the model is more realistic and the prediction precision of the clock skew is also improved.

Figure 14:
FIG. 14 is a circuit view in which a clock generator is directly connected to the flip-flop circuit block with the transmission line.
Figure 15:
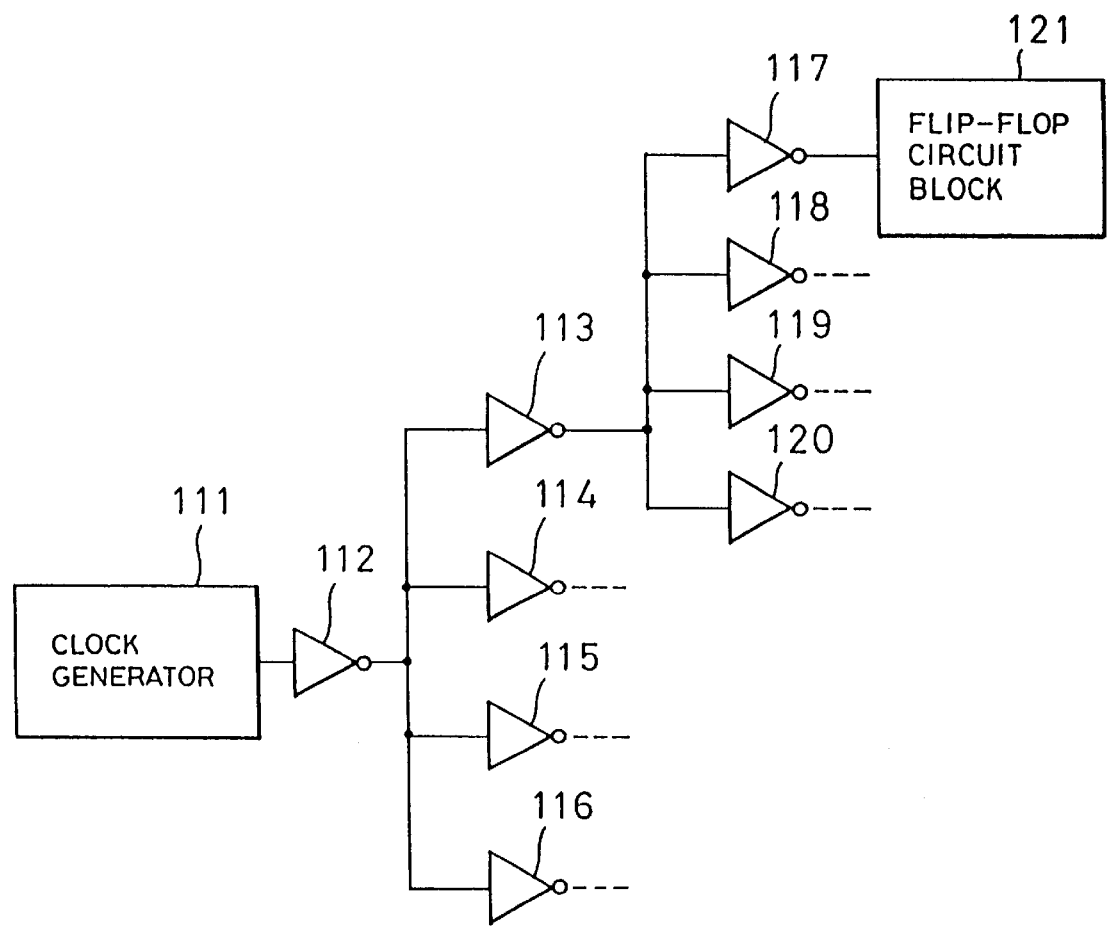
FIG. 15 is a circuit view in which the clock generator is connected with the flip-flop circuit block via the clock buffer.

In FIG. 14, the clock generator 131 is connected to the flip-flop circuit block 132 with the transmission line. In FIG. 15, the clock generator 111 is connected to the flip-flop circuit block 121 via clock buffers 112 through 120.

As shown in FIG. 14, when the clock transmission line becomes long, the transmission delay of the clock becomes long. Then, as shown in FIG. 15, a technology is developed for dividing this long transmission line into several stages and inserting buffers 112 through 120 between transmission lines to provide high speed. Furthermore, wiring for distributing the clock is considered so that the line is divided and branched to constitute a tree structure to equalize the wiring at each stage.

Furthermore, in the SUSPENS model, this tree structure is not considered, and the clock skew is set to $R_{int} \times C_{int} \times D_C^2/2$ as described above and becomes very large. However, according to the present invention, this tree structure is taken into consideration and the change in the wiring length at each stage is assumed and the clock skew is calculated. Consequently, the value of the clock skew calculated according to the present invention becomes more higher precise than the SUSPENS model.

Next, it is assumed that a large-scale circuit is designed with the combination of the plurality of circuit blocks, and an equation is provided for estimating the operating frequency, size, and consumed power of the each circuit block from the respective technology parameters, circuit parameters and clock parameters. Furthermore, the constant time of multiplication of the sum of the sizes of the circuit blocks is used as a reference for the length between circuit blocks, and the wiring delay of the length is also calculated. As a consequence, it becomes clear which circuit block, or which wiring delay between the circuit blocks, improves the performance of the LSI as a whole and becomes effective information in design so that, for example, a circuit block having a large wiring delay between blocks is arranged mutually adjacent in priority.

Next, an equation for predicting the performance of the semiconductor integrated circuit will be explained.

Each type of parameter used in this equation is such that the technology parameter comprises the gate length Lg of the transistor, an N channel MOS (hereinafter referred to as nMOS), a ratio Wg/Lg for an average gate width against the gate length in the transistor, power source voltage $V_{DD}$, threshold value voltage $V_{TM}$, gate oxide film thickness $t_{gox}$, wiring resistance $R_{int}$ for the unit line length, wiring capacity $C_{int}$ for the unit line length, ratio ferroelectric rate $\epsilon'$ for the interlayer film, wiring layer number $n_w$, wiring pitch $p_w$, wiring efficiency $e_w$, and wiring length ratio $R_o$ between blocks, and the circuit parameter comprises transistor number Ng, stage numbers of logic $f_{ed}$, average gate fanout fg, duty factor fd (a ratio for the number of transistors operated at an arbitrary time against all transistors), Lenz index p, and wiring length ratio rl between blocks, and the clock parameter comprises branch number nb for each stage of the clock buffer, flip-flop number nf connected to the clock buffer at the final stage, and change rate $\Delta l_o/l_o$ of the wiring length between clock buffers.

Firstly, average wiring length $\overline{R}$, in which the gate pitch serves as a unit, can be represented as follows by using transistor number Ng and the Lenz index p:

$$\overline{R} = \frac{Ng^p\left(\frac{-p-1+4^{p-0.5}}{2(p+0.5)(p-0.5)p(p-1)}\right)}{\left(Ng^{p-0.5}\frac{-2p-1+2^{2p-1}}{p(2p-1)(p-1)(2p-3)} - \frac{1}{6p\sqrt{Ng}} + \frac{1}{p-0.5} - \frac{\sqrt{Ng}}{p-1}\right)} + \left(\frac{1}{p} - \frac{\sqrt{Ng}}{P-0.5} - \frac{1}{6\sqrt{Ng}(p+0.5)}\right) \quad (1)$$

Next, assuming that the chip (or block) area is limited by wiring housing capacity, gate pitch dg and chip (or block) area $D_c$ is represented as follows:

$$dg = \frac{fg\overline{R}p_w}{e_w n_w} \quad (2)$$

$$D_c = dg\sqrt{Ng} \quad (3)$$

Average wiring length lav is represented as follows from equations 1 and 2:

$$l_{av} = \overline{R} \cdot dg \quad (4)$$

ON resistance $R_{tr}$ of the minimum size nMOS transistor is represented as follows:

$$R_{tr} = \frac{1}{\mu C_{gox}(V_{DD} - V_{TH})} \quad (5)$$

However, symbol $\mu$ denotes the carrier movement degree of N silicon. Symbol $C_{gox}$ denotes gate oxide film capacity for the unit area.

In the CMOS gate, the Wg/Lg ratio of the pMOS transistor is set to two times the nMOS transistor so that the ON resistances of the P channel MOS (hereinafter referred to as pMOS) transistor and the ON resistance of the nMOS transistor are mutually balanced. Considering the nMOS transistor and fanout fg, output resistance $R_{gout}$ of the gate and input capacity $C_{gin}$ are represented as follows:

$$R_{gout} = fg\frac{R_{tr}}{Wg/Lg} \quad (6)$$

$$C_{gin} = 3C_{gox}WgLg \quad (7)$$

Furthermore, since average gate delay Tg becomes a delay when the load of wiring of average wiring length $l_{av}$ and the load of input capacity $C_{gin}$ are applied to the gate output of output resistance $R_{gout}$ of equation 6, the equation can be represented as follows:

$$Tg = fgR_{gout}(C_{int}l_{av} + C_{gin}) + R_{int}l_{av}(\tfrac{1}{2}C_{int}l_{av} + C_{gin}) \quad (8)$$

Next, delay $T_d$ can be represented as follows because the Wg/Lg ratio of the clock buffer is denoted by hcb, chip area $D_c$ is driven by the $N_{cb}$ stage of the clock buffer, and the clock buffer is nb-branched for one stage:

$$T_d = (N_{cb} - 1)\left\{n_b\frac{R_{tr}}{h_{cb}}\left(C_{int}\frac{D_c}{N_{cb}} + h_{cb}C_o\right) + R_{int}\frac{D_c}{N_{cb}}\left(\frac{1}{2}C_{int}\frac{D_c}{N_{cb}} + h_{cb}C_o\right)\right\} + n_f\frac{R_{tr}}{h_{cb}}\left(C_{int}\frac{D_c}{N_{cb}} + C_{ff}\right) + R_{int}\frac{D_c}{N_{cb}}\left(\frac{1}{2}C_{int}\frac{D_c}{N_{cb}} + C_{ff}\right) \quad (9)$$

Symbol $C_o$, however, denotes minimum gate input capacity, symbol $C_{ff}$ denotes the input capacity of a flip-flop, and the two are represented as follows:

$$C_o = 3C_{gox}Lg^2 \quad (10)$$

$$C_{ff} = 3C_{gin} \quad (11)$$

Symbols $N_{cb}$ and $h_{cb}$ are represented as follows given the condition that delay $T_d$ is set to the minimum:

$$N_{cb.min} = \frac{\ln N_{ff} - \ln n_f}{\ln n_b} + 1 \quad (12)$$

$$h_{cb} = \sqrt{\frac{R_o C_{int} D_c\left(n_b + \frac{n_f}{N_{cb} - 1}\right) + R_o N_{cb} C_{ff}\frac{n_f}{N_{cb} - 1}}{R_{int} D_c C_o}} \quad (13)$$

Then, since the clock skew is a delay difference primarily caused by the difference in the wiring length between clock buffers, and the wiring difference for each wiring section is $2\Delta l_o$, clock skew $T_{skew}$ can be represented as follows:

$$T_{skew} = (N_{cb} - 1) \times 2R_{int}\Delta l_o(C_{int}l_o + h_{cb}C_o) + 2R_{int}\Delta l_o(C_{int}\Delta l_o + C_{ff}) + (N_{cb} - 1) \times 2n_b\frac{R_{tr}}{h_{cb}}C_{int}\Delta l_o \quad (14)$$

$l_o$, however, can be calculated from the following equation:

$$l_o = D_c/N_{cb} \quad (15)$$

$\Delta l_o/l_o$ is given as a parameter, so $\Delta l_o$ can be calculated from the following equation:

$$\Delta l_o = l_o \cdot (\Delta l_o/l_o) \quad (16)$$

Here, change rate $\Delta l_o/l_o$ of the wiring length between clock buffers will be briefly explained. Now, suppose that reference numeral 11 denotes the length of a transmission channel from the clock generator to the first clock buffer, 12 the length of the transmission channel up to the second clock buffer, 13 the length of the transmission channel up to the third clock buffer, and 14 the length of the transmission channel up to the fourth clock buffer.

The average value of 11 through 14 is then set to $I_o$. Next, a value obtained by subtracting the minimum value from the maximum value of numeral 11 to 14 is set to $2\Delta l_o$, and $\Delta l_o$ is calculated from it.

Then, supposing that $\Delta l_o/l_o$ is definite at all clock buffer stages, the delay difference is calculated.

Finally, operating frequency $f_c$ of the semiconductor integrated circuit or the circuit block is represented as follows by using average gate delay Tg, logic stage $f_{ed}$, clock skew $T_{skew}$, and transmission speed $v_c$ of the magnetic wave on the chip.

$$f_c = \left(f_{cd}Tg + T_{skew} + \frac{D_c}{v_c}\right)^{-1} \quad (17)$$

Then, the following equation is established:

$$V_c = \frac{C_o}{\sqrt{\varepsilon'}} \quad (18)$$

Here, symbol $C_o$ denotes the speed of light.

Furthermore, consumed power $P_c$ of the semiconductor integrated circuit or the circuit block can be calculated as follows by using operating frequency $f_c$ and $C_c$, which denotes total capacity:

$$P_c = \frac{1}{2} f_c f_d C_c V_{DD}^2 \quad (19)$$

The following equation, however, can be represented as follows.

$$C_c = \frac{D_c^2 n_w e_w C_{int}}{P_w} + C_{gin} Ng fg \quad (20)$$

Thus, when the technology parameter of each circuit block, circuit parameter, and clock parameter are given, the respective operating frequency, size, and consumed power can be calculated.

When the wiring delay between each blocks is calculated by setting the block size of circuit block A to Dc1 and setting the block size of circuit block B to Dc2, the wiring delay TdAB between blocks A and B can be calculated by multiplying the constant rl.

$$T_{dAB} = rl(D_cA + D_cB)R_{int}C_{int}/2 \quad (21)$$

Figure 6:
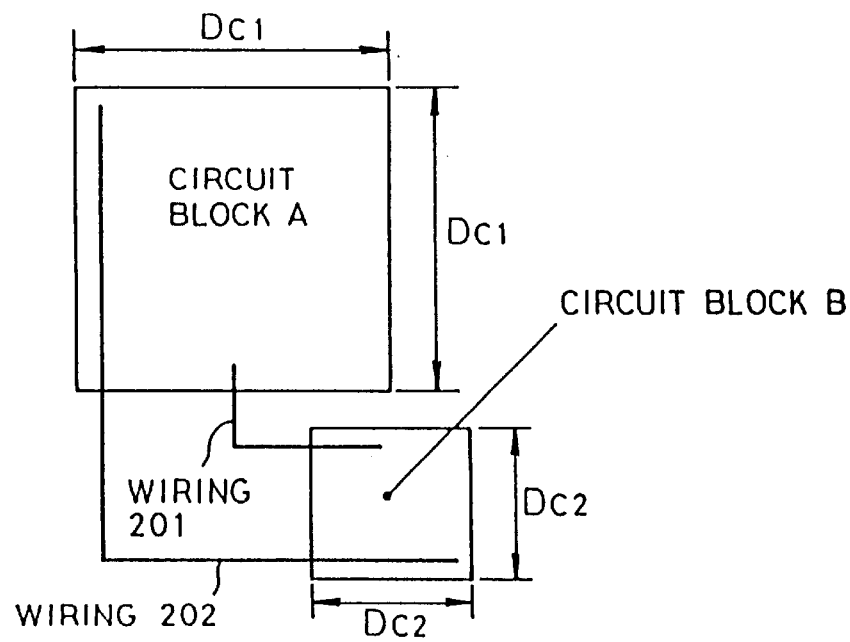
FIG. 6 is a model explanation view for explaining wiring delay of the system.
Figure 7:
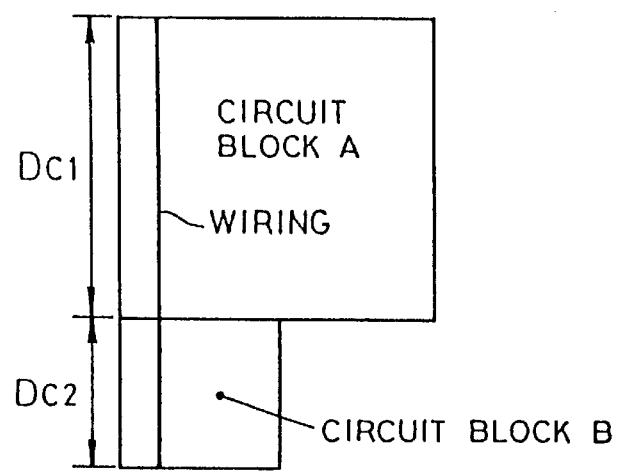
FIG. 7 is a model explanation view for explaining wiring delay of the system.
Figure 8:
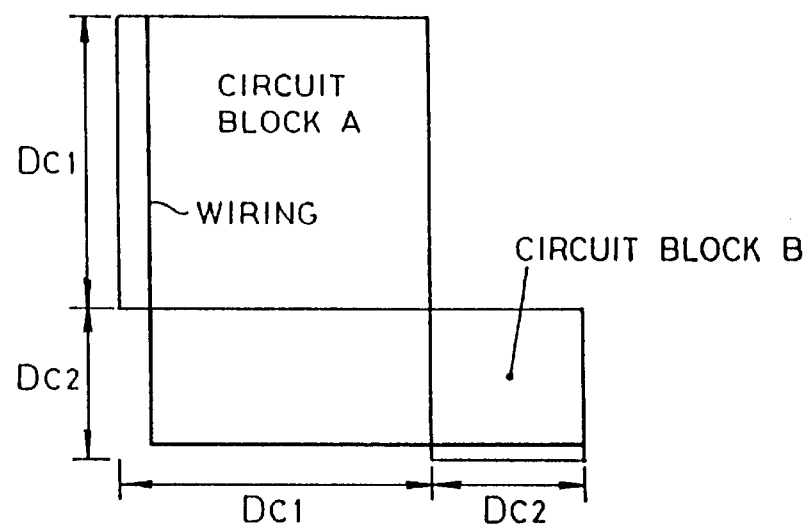
FIG. 8 is a model explanation view for explaining wiring delay of the system.

Next, wiring delay $T_{dAB}$ will be briefly explained. FIGS. 6 to 8 are model explanation views for explaining a wiring delay $T_{dAB}$.

As shown in FIG. 6, wiring between circuit blocks A and B, is short wiring such as wiring 201 and long wiring such as wiring 202. Then, a certain length is assumed for calculating a typical value as the wiring delay.

The method calculates the value as follows: When the circuit block A size is set to Dc1 and circuit block B size is set to Dc2, the wiring delay=k×(Dc1+Dc2) is represented. Here, symbol k is a proportional constant, which is typically represented as k=1. When circuit blocks A and B are located adjacent to each other, a maximum wiring delay is provided at the time k=2. Incidentally, k is equivalent to the wiring length ratio rl between blocks. Dc1 and $D_c$A of the equation 21 are equivalent to each other. Dc2 and $D_c$B of the equation 21 are also equivalent to each other.

FIG. 7 shows a position relationship between circuit blocks A and B in which the wiring between the circuit blocks A and B becomes a minimum.

FIG. 8 shows a position relationship between circuit blocks A and B in which the wiring becomes maximum. In FIG. 7, the wiring length becomes (Dc1+Dc2) while the wiring length becomes 2 (Dc1+Dc2) in FIG. 8. Consequently, when k for FIG. 7 is set to 1, k becomes 2 in FIG. 8.

In this equation 21, it is assumed that all circuit blocks are located adjacent to each other, so the equation is not accurate. However, the equation can be used as data reference when the circuit block is laid out. A layout principle, for example, is determined for prioritizing circuit blocks having a large delay between circuit blocks adjacent to each other. Operating frequencies of circuit blocks are compared so that an calculation is made in which the operating frequency of the semiconductor integrated circuit as a whole can be operated composed of circuit blocks.

When such parameters as the technology parameter of each block, circuit parameter, and clock parameter are provided as input, a design support system is provided where the operation of outputting the operating frequency of each block, size, consumed power, and wiring delay between respective blocks can be easily realized on a World-Wide Web (WWW) browser by describing the program with a network-oriented language such as Java, or a Common Gate Interface (CGI) script such as Perl. As a consequence, anyone can obtain information for design easily by simply accessing to a predetermined WWW home page. Furthermore, when a fire wall is designed, it is possible for a specific design development group alone to access the home page. Here, the fire wall refers to a design for connecting a network (for example, an intranet) of an organization to an internet to restrict access from outside the organization.

Furthermore, all of input parameters such as those comprising the technology parameter of each block, circuit parameter, and clock parameter and output results such as the operating frequency of each block, size, consumed power, and wiring delay between blocks can be output in the format of a predetermined data format. At the same time, a design support system is proposed wherein this data format can be retrieved, used, and retained as a library via an internet or an intranet within the specific or nonspecific design developer. For design information described in this data format, information can be shared only within the specific design development group based on the setup of the fire wall.

Figure 1:
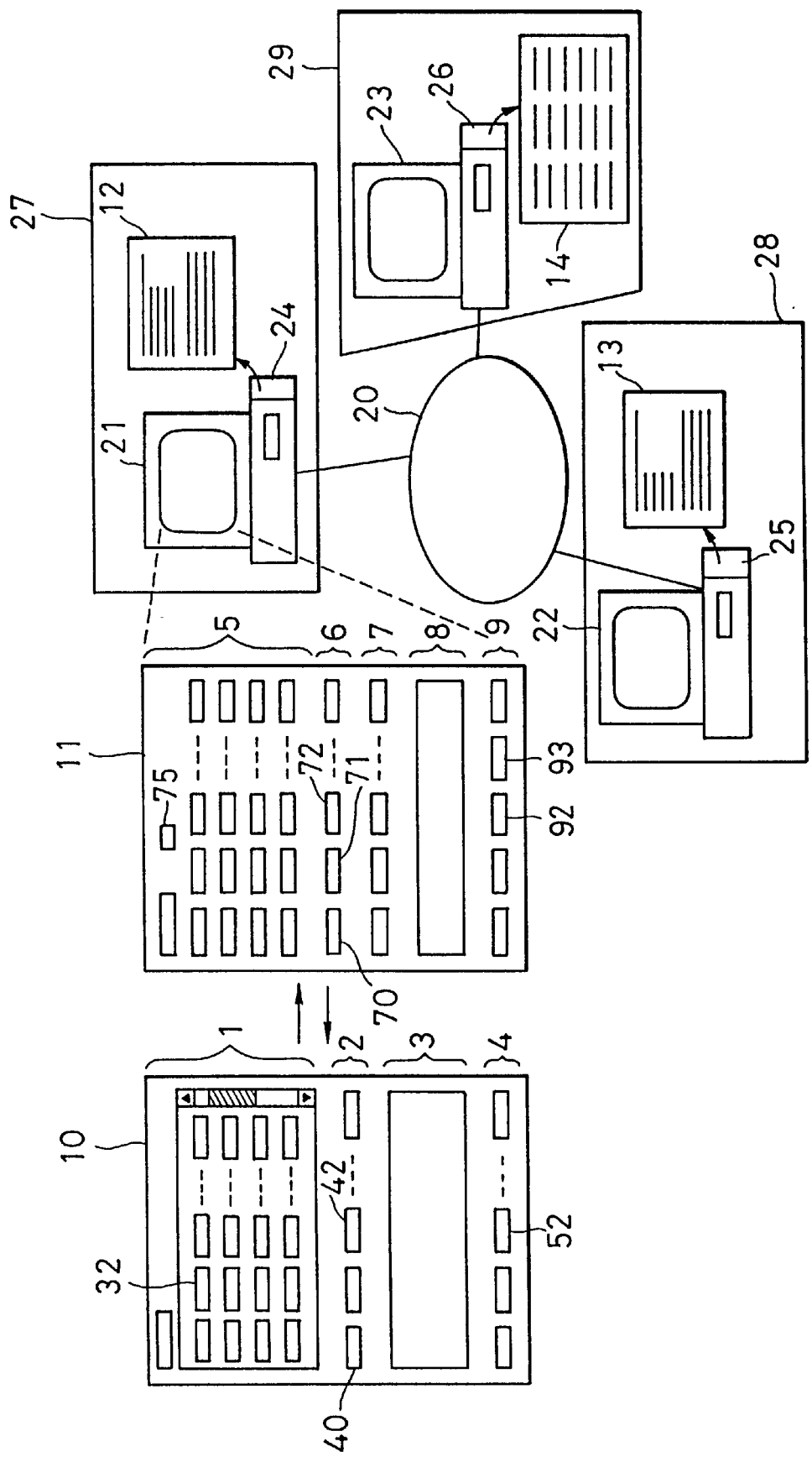
FIG. 1 is an overall structure view showing a design support system of a semiconductor integrated circuit according to the present invention.

Next, a structure of a design support system of this semiconductor integrated circuit will be explained. FIG. 1 is an overall structure view showing a design support system of the semiconductor integrated circuit according to the present invention.

The design support system of the semiconductor integrated circuit comprises a system analysis browser 10, and a circuit block analysis browser 11. These software items are displayed on a computer display, and a parameter input and calculation result are displayed by clicking a predetermined point on the screen with a pointing device and the like.

This system analysis browser 10 and circuit block analysis browser 11 are constituted so that browsers can be shared via a communication network 20 (an internet: for example, a network connected based on common rules referred to as an internet protocol) at a development design departments 27 and 28, and a control center 29.

In other words, the development design departments 27 and 28, and the control center 29 are connected to each other via the communication circuit network 20.

The development design department 27 has a computer 21 connected to a memory device 24. Reference numeral 12 schematically shows the system analysis data format of the computer 21.

The development design department 28 has a computer 22 connected to a memory device 25. Reference numeral 13 schematically shows the system analysis data format of the computer 22.

The control center 29 has a computer 23 connected to a memory device 26. Reference numeral 14 schematically shows the data library of a semiconductor integrated circuit or a circuit block of the computer 22.

Furthermore, the program of the design support system (namely, the system analysis browser 10 and the circuit block analysis browser 11) is to be stored in the memory device 26 of the control center 29 in the present embodiment. However, the present embodiment is not limited thereto. The program may be stored in the memory device 24 of the development design department 27 or the memory device 25 of the development design department 28, or the program may be stored in a plurality of places thereof. Incidentally, it is required that a software (for example, WWW) server must be stored for using the communication line 20 in addition to this program.

Figure 2:
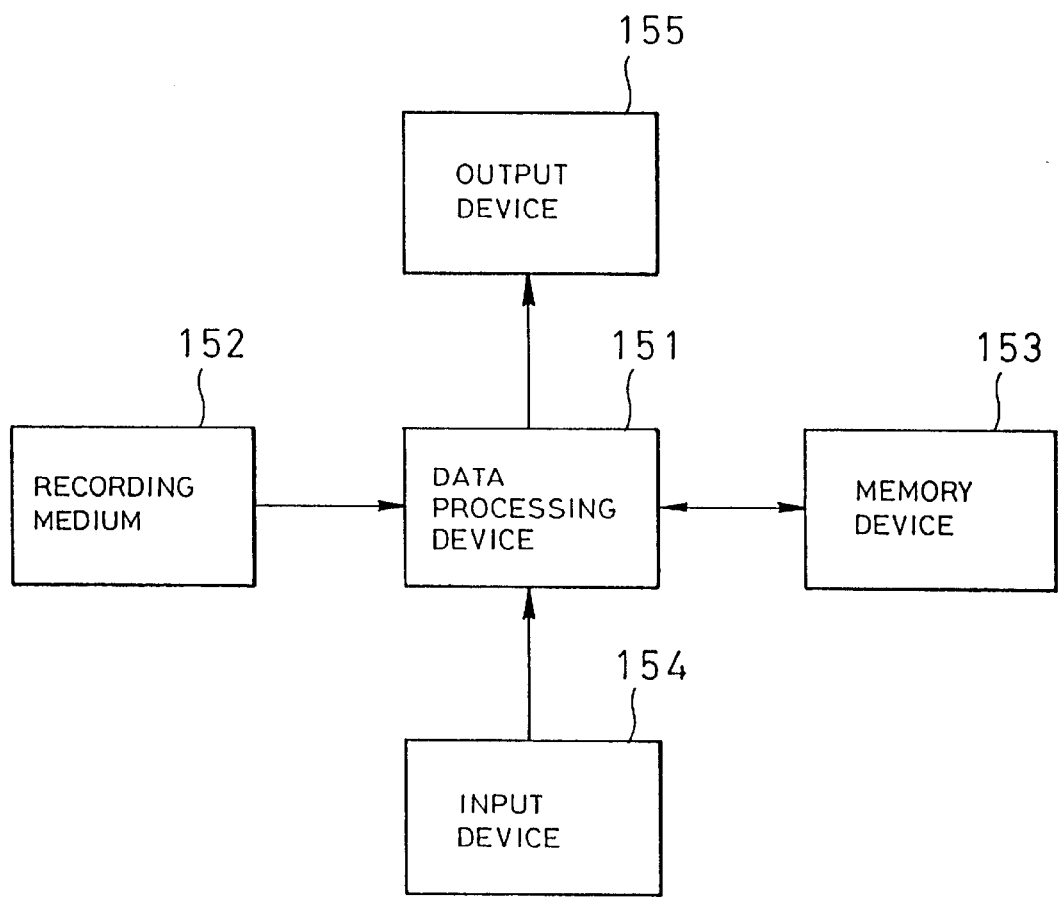
FIG. 2 is a structure view of a computer system including a recording medium of the system.

Next, the recording medium which the program of this design support system stores will be explained. FIG. 2 is a structure view of a computer system including the recording medium. This computer system corresponds to the computers 21 through 23 which have been described. The recording medium corresponds to the above-mentioned memory devices 24 through 26 respectively.

The computer system comprises a data processing device 151, a recording medium 152, a memory device 153, an input device 154, and an output device 155.

The recording medium 152 is, for example, a magnetic disk such as a hard disk or the like. The recording medium 152 may be other medium if the medium records binary data.

The recording medium 152 stores a program of a design support system. Firstly, the program is loaded on the memory device 153 from the recording medium 152 with the disk processing device 151. Then the program can be started.

Next, when the parameter is input form the input device 154, the data processing device 151 conducts a predetermined calculation in accordance with the program. Then, the input parameter and the calculation result are displayed on the output device 155.

Furthermore, the input device 154 and the output device 155 are provided with an input/output interface which is not shown, and are connected with the other computer via the communication line network 20.

Consequently, the parameter input from another computer can be processed with the data processing device 151 via this input device 154. Furthermore, the calculation result for this data processing device 151 can be displayed on the output device 155 of the other computer via the output device 155.

Figure 3:
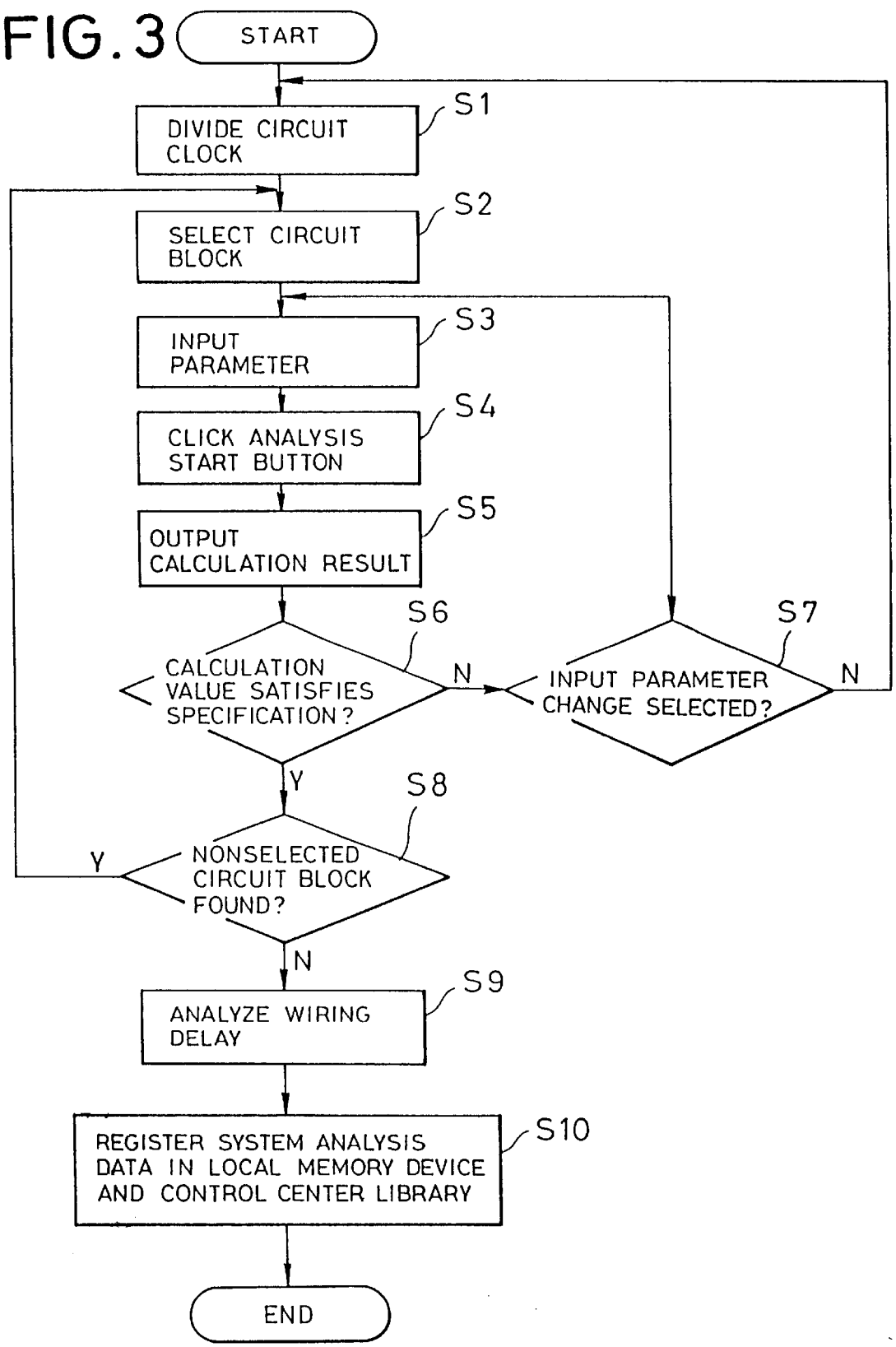
FIG. 3 is a flowchart showing operation of the system.

Next, the system analysis browser 10 and the circuit block analysis browser 11 will be explained by referring to the flowchart showing operation of the design support system of FIG. 3.

The system analysis browser 10 can retrieve the calculation result of each circuit block, and can confirm the calculation result of wiring delay between respective circuit blocks.

The circuit block analysis browser 11 inputs parameters required for each circuit block to obtain the calculation result (performance estimation) for each circuit block. The system analysis browser 10 determines which of the circuit blocks should be designated.

Firstly, in the system analysis browser 10, the semiconductor integrated circuit is divided into several circuit blocks (S1), and, next, the required circuit block is designated (S2). When the analysis button 32 of respective circuit blocks is clicked, the process moves to the circuit block analysis browser 11. After each parameter of the circuit block is input on the circuit block parameter input panel 5 (S3), calculation is conducted in accordance with equations 1 through 20 upon clicking the circuit block analysis start button 70 incorporated in the circuit block analysis control panel 6 (S4), and the calculation result is output to the circuit block analysis data output panel 7 (S5).

If the desired result is not obtained (S6), input data is changed (S7, S3) to click the analysis start button again (S4). If it is desired that data be corrected from the beginning, the circuit block input panel clear button 71 incorporated in the circuit block analysis control panel 6 is clicked to clear the input parameter (S7, S1).

When an output button 72 of the circuit block analysis result data format incorporated in the circuit block analysis control panel 6 is clicked, the input parameter and the calculation result are output to the circuit block analysis data format panel 8 in the data format. When the data format output button 72 is clicked after the parameter is newly input for calculation, further new data is added to the data up to that time.

The circuit block analysis data format control panel 8 is provided with a button for loading data of the established semiconductor integrated circuit or data of the circuit block via an internet or an intranet (a communication network for using the internet for communication in the organization). As a consequence, data can be loaded and used from a data library 14 possessed and controlled by the control center 29, libraries 12 and 13 of the design group 27 and 28 of the other department in the same organization or data libraries built within the own department. At this time, a fire wall is set to restrict access to the data library and data is loaded via the FTP client to facilitate security for the data library.

Here, the FTP (file transfer protocol) client refers to software for moving a file via the internet.

The updating of each value in the text field of the input panel can be carried out when data is loaded. Otherwise, the data update button is used, and data updating can be initiated by clicking the button. When loaded data spans more than one line, certain lines of the data can be selected for setting in the text field when the input parameter is updated.

Furthermore, data can be stored in local memory devices 24 and 25 with the data save button 92 of the data format control panel 9. The parameter of the new circuit block may be registered in a library 14 of the control center 29 or the like with the data registration button 93. In registration, when a method is adopted for sending information by electronic mail (a function of sending a message to the designated address) to the control department 29 and registering the information after inspecting the data in the control department 29, higher security can be secured.

Furthermore, to simplify a parameter input to some extent, a button is provided for setting and inputting a default value (a standard value) and a choice button can be set so that the parameter can be selected from a set of several input parameters.

When a set of input parameter and a calculation value of the set is fixed to some extent, the system analysis browser return button 75 is clicked and the process returns to the screen of the system analysis browser 10. At this time, the set of input parameters used in the inspection of the circuit block analysis browser 11 and the calculated output data are loaded so that the set of input parameters and output data can be used in the system analysis browser 10. Loaded data is a set of data output to the data format panel 8 in the circuit block analysis browser 11. At the time data is loaded, a value is displayed on the input text field of the circuit block designated former times of the circuit structure input panel. Otherwise, the data display button is used to display data by clicking the button. The data displayed here may be a set of data which is necessary for system analysis. For example, there may be the size of blocks, operating frequency, and consumed power. When loaded data spans more then one line, it may be set so that certain lines of input parameters can be set in the text field when the input parameter is updated.

From such declaration of the circuit block, an operation to calculate circuit block performance in the circuit block analysis browser 11 and the loading of the circuit block performance analysis result is repeated by the number of circuit blocks (S8). After the circuit block constitution is ended, wiring delay between circuit blocks is analyzed upon clicking the system analysis start button 40 incorporated in the system analysis control panel 2, thereby displaying the calculation result on the system analysis data format panel 3 together with circuit block performance (S9).

By observing the analysis result at this time for example, wiring delay between circuit blocks and the operating frequency of the circuit block, the process can be brought back to circuit block analysis by clicking the circuit block analysis button 32 when needed. Otherwise, a temporary value is input for the circuit block performance value so that the change in system performance as a whole can be observed. However, in this case, it is necessary to show that the set of data of the changed circuit block is not valid. For this purpose various methods are provided for setting in advance, for example, a variable showing validity or nonvalidity, setting a state of nonvalidity and making text field characters showing system performance of the circuit block in red.

When a circuit block analysis button 32 is clicked for the circuit block in which the performance value is changed, a correct value by analysis is not set in part of the performance value in the circuit block analysis data format when moving to the circuit block analysis browser 11, At this time, the character is displayed in red to show that data is not an analyzed value. Analysis is made by changing the input parameter so that the value comes close to this value. When a sufficient value is given, the process is brought back to the system analysis browser 10 so that more correct analysis of the overall system can be made.

When it is desired that the performance analysis result of the overall system be stored, the data save button 52 on the system analysis data format control panel 4 is clicked, and data can be recorded on local memory devices 24 and 25 (S10). At this time, a set of input parameters for each circuit block and a performance value can be stored at the same time. For this purpose, before clicking, for example, the data save button 52, a set of input parameters for each circuit block and performance value are added to be saved in the system analysis data format by clicking the circuit block analysis data addition button 42.

The performance analysis result of the overall system can be registered in the library 14 such as the control center 29 in the same manner as the circuit block (S10). However, there is the data which is attached with input parameter value of each circuit block or minimum data for the circuit block or data of only wiring delay between circuit blocks without the input parameter data of each circuit block. Furthermore, these items of data can be classified with an extender so that analysis data of the circuit block can be differentiated. Furthermore, for the system analysis data registered, when a method is adopted for sending information by electronic mail to the control department the same as the case of circuit block analysis data and inspecting at the control department and registering data, higher security can be secured.

Up to here will be explained a case for starting new system analysis. After system performance analysis data is loaded, it is possible to improve analysis data. At this time, there is a case in which data connected to circuit block data is loaded, and a case in which minimum data for the circuit block and data on only wiring delay between circuit blocks is loaded.

In the former case, it is possible to update the circuit block structure input panel at the same time as loading data, and it is possible to start updating by clicking the circuit block structure input panel renewal button. When the circuit block analysis browser calling button is clicked after updating, selected circuit block analysis can be made immediately.

However, after data is loaded in the latter case, it is possible to update the circuit block structure input panel. However, since data on the parameter of individual circuit blocks is insufficient, the data loading operation is initiated after changeover of the browser by clicking the circuit block analysis browser calling button 32. However, the circuit block analysis data of the object circuit is loaded from the library 14 of the control center 29, the libraries 12 and 13 of the memory devices 24 and 25 of the locals 27 and 28, the circuit block analysis can be initiated.

Next, details of the operation of the system analysis browser 10 and the circuit block analysis browser 11 will be explained.

Figure 4:
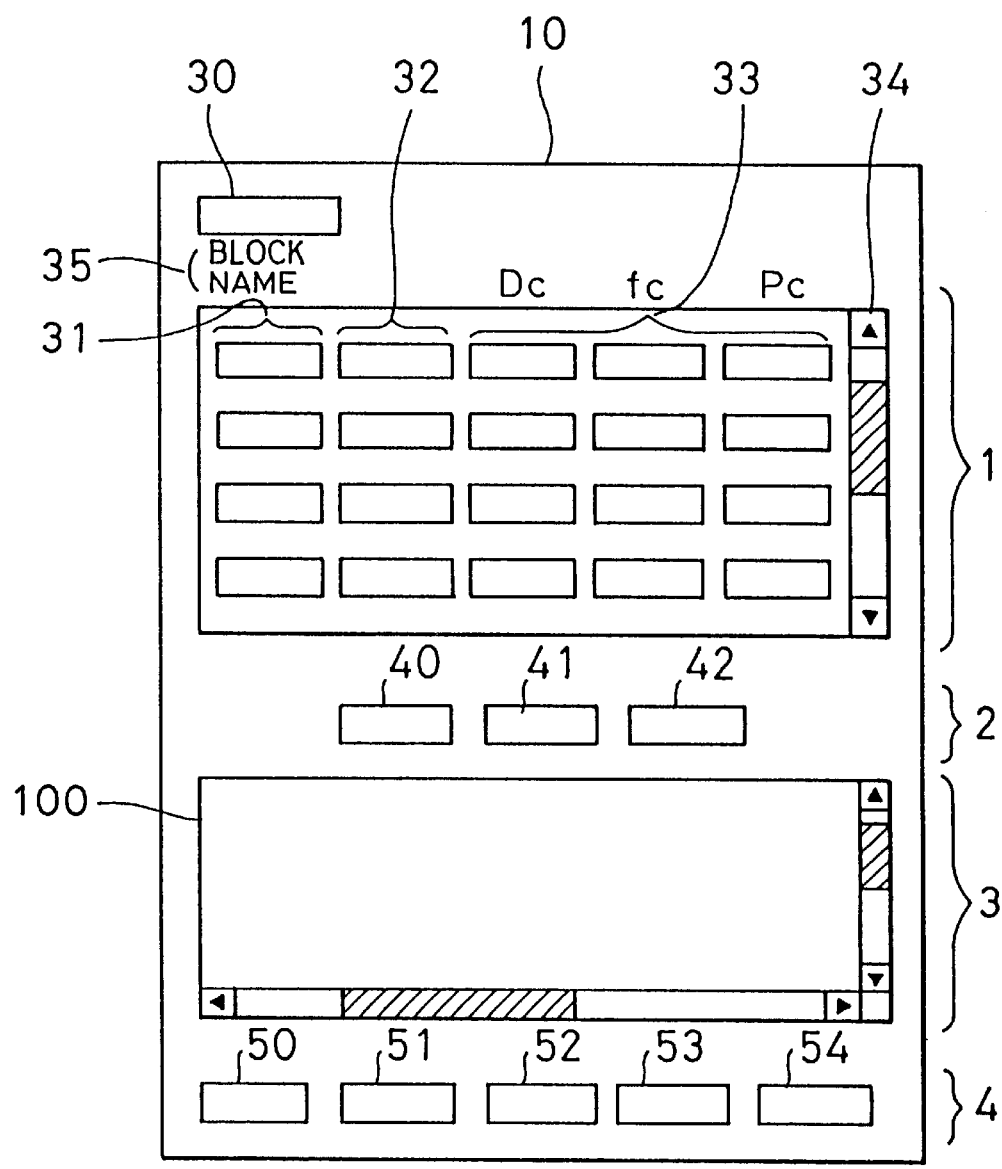
FIG. 4 is a structure view showing one example of a system analysis browser of the system.

FIG. 4 shows a structure view of one example of the system analysis browser 10. An overall structure comprises text field 30 for inputting the name of the semiconductor integrated circuit, a circuit block structure input panel 1, a system analysis control panel 2, a system analysis data format panel 3, and a system analysis data format control panel 4.

In the circuit block structure input panel 1, a circuit block constituting the semiconductor integrated circuit is described, and respective prediction performance will be displayed. In the system analysis control panel 2, an instruction for a process such as calculation of performance for an overall system is given from the predicted performance of the individual circuit blocks to be constituted. On the system analysis data format panel 3, the performance analysis result of the system is displayed. On the system analysis data format control panel 4, an instruction is given for a process so that system analysis data is retained and loaded.

Firstly, the name of the semiconductor integrated circuit is input to the text field 30 for inputting the name of the semiconductor integrated circuit. Based on the characters which are described here, the file name of the system analysis data will be determined.

Now, each circuit block constituting the semiconductor integrated circuit is described for the circuit block structure input panel 1. When the circuit block structure input, a label 35 is displayed, and the meaning can be easily understood for subsequent parameters. The name of each circuit block is input to the circuit block name input field 31. The file name for circuit analysis is determined from characters input to this field.

Then, when the circuit block analysis browser calling button 32 located adjacent thereto is clicked, the device is changed over to the circuit block analysis browser 11 with the result that each input parameter of the circuit block is input and the performance prediction value of the circuit block is calculated.

When the device is brought back to the system analysis browser 10 after ending circuit block analysis, the calculated value will be displayed on the circuit analysis result output text field 33.

The same operation will be performed with respect to all circuit blocks that constitute the integrated circuit. When the number of the circuit block number is incremented, the circuit structure input panel scroll bar 34 is used to scroll the input panel, thereby making it possible to display the lower line.

When the performance prediction value of all circuit blocks has been displayed, the system analysis start button 40 of the system analysis control panel 2 is clicked to calculate the wiring delay between the circuit blocks of all assemblages according to the equation 21. When calculation is ended, the performance prediction value of each block and data of the calculation of wiring delay between circuit blocks will be output to the system analysis data format panel 3. When the system analysis start button 40 is clicked while varying the circuit block structure and the input parameter of the circuit block, calculation is newly performed, and a new value is overwritten to the system analysis data format.

When the circuit block analysis data addition button 42 is clicked, the input parameter of each circuit block and analysis result are added to the line under the system analysis data 100.

When the circuit structure input panel clear button 41 is clicked, the circuit block input panel is cleared completely.

When the system analysis data save button 52 of the system analysis data format control panel 4 is clicked, data displayed on the system analysis data format 3 will be saved in the memory device 24 and 25 of the locals 27 and 28. At this time, an extender of the file name differs depending on the case in which the analysis data of each circuit block is added or not to the system analysis data 100 format. As a consequence, when system analysis data is loaded later, it becomes possible to differentiate which type of data is used simply by looking at the file name.

When the system analysis data registration button 53 is clicked, system analysis data is either directly or indirectly registered in the library 14 of the control center 29. The data format may be sent through the CGI or to the control center 29 via electronic mail (e-mail)

When the system analysis data load button (local) 50 is clicked, system analysis data can be retrieved from the libraries 12 and 13 that are saved in memory devices 24 and 25 of the locals 27 and 28. At this time, the system analysis data format is replaced, and all content such as the circuit block structure input panel 1 and the input parameter of each circuit is replaced.

The same holds true when the system analysis data load button (control center) 51 is clicked. However, the system differs in that data is loaded from what is registered in the library 14 of the control center 29. For example, FTP client is activated, data is brought from a predetermined directory of the control center. When only those who are registered as users at the control center can obtain data at FTP, security can be ensured.

When the system analysis data clear button 51 is clicked, all values and characters input to the system analysis browser are cleared.

Figure 5:
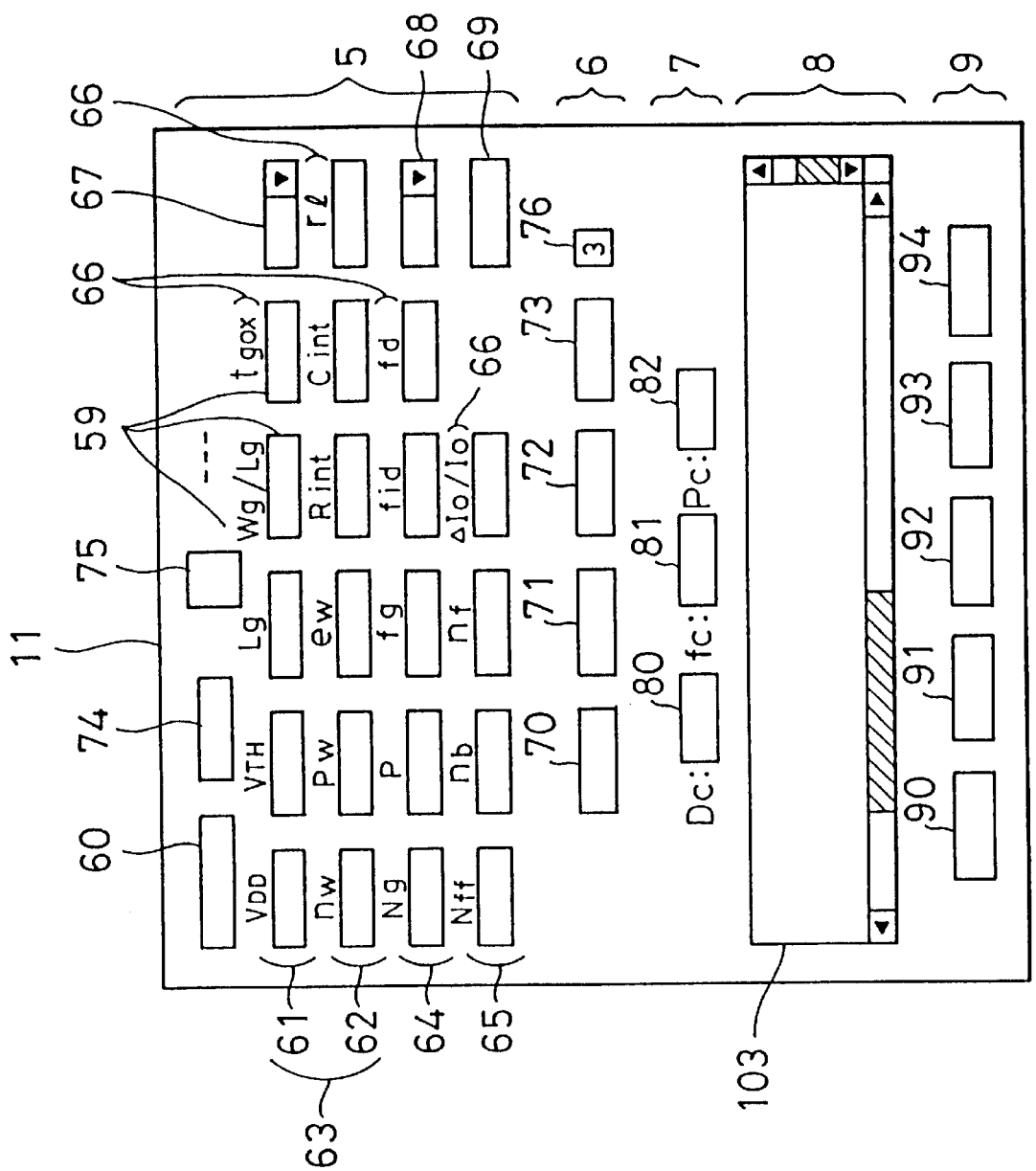
FIG. 5 is a structure view showing one example of a circuit block analysis browser of the system.

FIG. 5 shows a structure view of one example of a circuit block analysis browser 11. An overall structure comprises a circuit block parameter input panel 5, a circuit block analysis control panel 6, a circuit block analysis data output panel 7, a circuit block analysis data format panel 8, and a circuit block analysis data format control panel 9.

In the circuit block parameter input panel 5, each parameter of the circuit block is input. In the circuit block analysis control panel 6, an instruction is given for a process such calculation of the performance of the circuit block based on the input parameter. In the circuit block analysis data output panel 7, the predicted performance value for the calculated circuit block is displayed. In the circuit block analysis data format panel 8, circuit analysis data such as input parameters and the performance predicted value are displayed. On the circuit block analysis data format control panel 9, an instruction is given for a process such as saving circuit block analysis data and loading the data.

When the circuit analysis browser 11 is called from the system analysis browser 10, while the name of the designated circuit is displayed in the circuit block name display text field 60, the circuit analysis browser 11 is activated. Here, in a case in which the circuit block is analyzed for the first time, all blanks are displayed on the other part. When what was subjected to circuit block analysis is analyzed again, values in the former analysis will be displayed. In a case in which after data connected to circuit block analysis data is loaded with the system analysis browser 10 the circuit block analysis browser 11 is called, loaded data is displayed. In a case in which after the data without circuit block analysis data is loaded at system analysis browser 10 or the temporary performance predicted value of the circuit block is input at new system analysis browser 10, the circuit block analysis browser 11 is called and the temporary performance value is displayed on the circuit clock data output panel 7.

Next, respective values are input to each input text field 59 of the circuit block parameter input panel 5. At this time, when the circuit block input parameter label 66 is displayed, each parameter value can be input without error. The process is apparent when the type of the parameter is classified for each line. For example, for the transistor parameter such as $V_{DD}$ or the like, input text field 59 is arranged in the transistor parameter input area 61. For wiring parameters such as nw or the like, text fields 59 are arranged in the wiring parameter input area 62. For circuit parameters such as Ng or the like, text fields 59 are arranged in the circuit parameter input area 64. For clock parameters such as $N_{ff}$ or the like, text fields 59 are arranged in the circuit parameter input area 65. Reference numerals 61 and 62 are together referred to as a technology parameter input area.

A choice button or a default value input button may be prepared so that a set of certain input parameters are input together. For example, when the technology parameter choice button 67 is clicked, a pop-up list as shown in a structure view of one example of a pop-up list display screen of FIG. 9 appears. Then, when a certain item is selected, a value corresponding to that is input to the overall technology parameter. In the same manner, when the circuit parameter choice button 68 is clicked, a pop-up list as shown in the structure view of one example of the pop-up list display screen of FIG. 10 appears, and when the list is selected, the circuit parameter is input.

When the clock parameter default value input button 69 is clicked, the clock parameter set in advance will be input. Furthermore, after the value is set with the choice button 68 or the default button 69, a cursor is moved to the text field and the value can be overwritten.

When the value is input to all input text fields, calculation is performed in accordance with equations 1 through 20 upon clicking the circuit block analysis start button 70 on the circuit block analysis control panel 6, and the calculation result is output to the circuit block analysis data output panel 7. The block size Dc 8, the operating frequency $f_c$ 81, and consumed power $P_c$ 82 to be used later in system analysis are required to be output at a minimum as a calculation result. Other data output, for example, clock skew $T_{skew}$ may be added. After inspecting output data, the input parameter is changed again, and the circuit block analysis start button 70 is clicked, calculation is performed by using a new value, and the new value is overwritten to the circuit block analysis data output panel 7.

When the circuit block analysis data format output button 72 is clicked, all input parameters and part of the calculation result are displayed on the circuit block analysis data format panel 8. Every time this button is clicked, new circuit block analysis data is added to the final line of the circuit analysis data format.

When the circuit block input panel clear button 71 is clicked, the value set in the input text field 59 is cleared.

When the circuit analysis data save button (local) 92 on the circuit block analysis data format control panel 9 is clicked, circuit analysis data can be recorded by a local memory device 24 and 25. At this time, when a name with an extender determined for the circuit name is given as a file name, the file name can be easily referenced. It is, of course, necessary to set an extender different from system analysis data with circuit analysis data and system analysis data free from circuit analysis data so that the file name can be distinguished from such data.

When the circuit analysis data load button (local) 90 is clicked, circuit analysis data can be loaded from a local memory devices 24 and 25. At the same time, when data is loading ends, data is displayed on the circuit block analysis data format panel 8.

Here, when the circuit block input value renewal button 73 is clicked, the input parameter of the circuit analysis data format is set on the circuit block parameter input panel 5. When the circuit analysis data format spans more than one line, an instruction can be given in the line number designation text field 76 at what line value data is renewed.

The default of a value set in the line number designation text field 76 is 3 (standard), a line number free from data and an inappropriate line number such as 1 and 2 are set in an example in FIG. 5, the browser displays an error message at an appropriate place, and data is not renewed.

When the circuit analysis data load button (control center) 91 is clicked, the original place for loading becomes restricted to the control center 29; the remainder is the same as the local case 27 and 28. Data security in this case is ensured the same way for as data loading from the control center 29 of system analysis data.

When circuit block analysis ends, the system analysis browser return button 75 is clicked, and operation returns to the input screen of the system analysis. At this time, the input parameter and output analysis data of the circuit block analysis is given to the system analysis browser 10 to be displayed in the circuit analysis result output text field 33.

Furthermore, the circuit analysis data format clear button 94 is clicked, and data displayed on the circuit analysis data format panel is cleared.

FIG. 11 shows a structure view of a display screen of one example of circuit analysis data and part thereof. The first line shows data with an extender added to the circuit name. A label of each parameter is written on line 2, and on line 3 and subsequent lines are written the input parameter and part of the analysis result.

FIG. 12 shows a structure view of the display screen of one example of system analysis data free from the circuit analysis data, and part thereof. Line 1 shows a name of an integrated circuit with an extender, and lines 2 to 5 show analysis data ($D_c$, $f_c$ and $P_c$ as one example, here) of the circuit block (it is assumed that the circuit is composed of three blocks) of the circuit block to be constituted, the block being associated with system analysis. A number is given to the circuit block in an input order. Line 6 and subsequent lines show the wiring delay between circuit blocks by using a number added to the circuit block. This analysis data denotes a typical wiring delay value between circuit locks (for example, k=1). It is possible to display a maximum value (for example, k=2) together with this value.

FIG. 13 shows a structure view of a display screen of one example of system analysis data with circuit analysis data, and part thereof. From the last line of data of FIG. 12, analysis data of each circuit block is added.

Data in FIGS. 11 through 13 is such that the data can be classified with an extender. In FIGS. 11 through 13, bra, syi, and syp are determined as an extender, and a file name is shown in line 1 of each data item.

Examples shown in FIGS. 4 and 5 are cases in which all parameters are input for the respective circuit blocks. Parameters common to all circuit blocks can be input from the system analysis browser 10 in FIG. 4. In this case, when the circuit block analysis browser calling button 32 is clicked, data input as a common parameter is required for use by the circuit block analysis browser 11. Furthermore, different circuit block data is loaded with the circuit block analysis browser 10 to click the circuit block input valve button, the setting must be changed so that a parameter other than the common parameter is renewed. As a common parameter, for example, power source voltage $V_{DD}$, gate length Lg, wiring length ratio rl between blocks, wiring layer number $n_w$, wiring efficiency $e_w$, branch number per stage of the clock buffer nb, and a change rate of the wiring length between clock buffers $\Delta l_o/l_o$ can be given.

Furthermore, a case is explained in which the system analysis browser 10 (FIG. 4) and the circuit block analysis browser 11 (FIG. 5) are used together. Both the system analysis browser 10 and the circuit block analysis browser 11 can be used independently.

When the system analysis browser 10 is used independently, the circuit block calling button 32 is not used, prediction value and an empirical value of the designer are input to the circuit block analysis result output text field 33 to calculate system performance. Only system analysis data free from circuit block analysis data is output from the system analysis data format panel 3. Only this data is saved.

When the circuit block analysis browser 11 is used independently, the semiconductor integrated circuit name designation label 74 is left blank, the browser return button 75 does not be used in system analysis, and only performance calculation from the input parameter of the circuit block is conducted.

According to these two inventions, a prediction of a clock skew of each circuit block, the size of each circuit block, and an operating frequency and consumed power can be performed by inputting a technology parameter, circuit parameter, and clock parameter for each circuit block.

Furthermore, wiring delay time between circuits can be predicted based on the size of each circuit block.

Consequently, the overall calculation of the semiconductor integrated circuit comprising an assemblage of a plurality of circuit blocks can be predicted at an initial stage.

Furthermore, the method can include a step for making a prediction by remote control via the communication circuit so that this design support method can be used from a plurality of different places.

What is claimed is:

1. A method for supporting design of a semiconductor integrated circuit comprising an assemblage of a plurality of circuit blocks, the method comprising the steps of:

inputting a technology parameter concerning a circuit element and a wiring material constituting each circuit for each circuit block;

inputting a circuit parameter for determining a circuit scale of each circuit block;

inputting a clock parameter for a clock buffer that is inserted into a transmission line between a clock supply source and each circuit block for receiving the clock supply;

performing at least one of the following processes: calculation of a clock skew of each circuit block, size of each circuit block, an operating frequency and consumed power by using parameters input in each of said steps; and using said calculations to design and layout said circuit blocks.

2. The method for supporting design of the semiconductor integrated circuit according to claim 1 wherein said technology parameter includes gate length of said circuit element, gate length versus gate width ratio, power source voltage, threshold value voltage of said circuit element, wiring resistance and a capacity per unit length, a wiring layer number, wiring pitch, and a wiring efficiency value.

3. The method for supporting the design of the semiconductor integrated circuit according to claim 1 wherein said circuit parameter includes a number of a positive element, step number of the circuit element, average gate fanout, and Lenz's index.

4. The method for supporting the design of the semiconductor integrated circuit according to claim 1 wherein said clock parameter includes a branch number per each step of the clock buffer, a number of flip-flops connected to said clock buffer at a final stage of a transmission line, and a change rate of wiring length between clock buffers.

5. The method for supporting design of the semiconductor integrated circuit according to claim 1 wherein the method includes using a method for supporting design by remote control via a communication circuit.

6. The method for supporting design of the semiconductor integrated circuit according to claim 5 wherein said method for supporting design by remote control includes a step of holding in a readable and writable manner design information of each of said parameters, clock skew, the size of each circuit block, operating frequency, consumed power, and wiring delay time between respective circuit blocks.

7. A method for supporting design of a semiconductor integrated circuit comprising an assemblage of a plurality of circuit blocks, the method comprising the steps of:

inputting a technology parameter for a circuit element and a wiring material constituting each circuit for each circuit block;

inputting a circuit parameter for determining a circuit scale of each circuit block;

inputting a clock parameter for a clock buffer that is inserted into a transmission line between a clock supply source and each circuit block for receiving the clock supply;

calculating the size of each circuit block, operating frequency, and consumed power by using parameters input in each step;

calculating wiring delay time between respective circuit blocks based on the size of each circuit block; and using said calculations to design and layout said circuit blocks.

8. A design support system for a semiconductor integrated circuit comprising an assemblage of a plurality of circuit blocks, the system comprising:

means for inputting a technology parameter concerning a circuit element and wiring material constituting each circuit for each circuit block;

means for inputting a circuit parameter that determines a circuit scale of each circuit block;

means for inputting a clock parameter for a clock buffer that is inserted into a transmission line between a clock supply source and respective circuit blocks which receive the clock supply;

means for performing at least one of the following processes: calculation of the clock skew of each circuit block, size of each circuit block, an operating frequency and consumed power by using parameters input by each of said means, and means for outputting and displaying said calculations.

9. The design support system for the semiconductor integrated circuit according to claim 8 wherein the technology parameter includes gate length of said circuit element, gate length versus gate width ratio, power source voltage, threshold value voltage of said circuit element, wiring resistance and a capacity per unit length, a wiring layer number, wiring pitch, and a wiring efficiency value.

10. The design support system for the semiconductor integrated circuit according to claim 8 wherein said circuit parameter includes a number of a positive element, step number of the circuit element, average gate fanout, and Lenz's index.

11. The design support system for the semiconductor integrated circuit according to claim 8 wherein said clock parameter includes a branch number per each step of the clock buffer, a number of flip-flops connected to said clock buffer at a final stage of a transmission line, and a change rate of wiring length between clock buffers.

12. The design support system for the semiconductor integrated circuit according to claim 8 wherein said system includes using a means for supporting design by remote control via a communication circuit.

13. The design support system for the semiconductor integrated circuit according to claim 12 wherein said system includes means for holding in a readable and writable manner design information of each of said parameters, clock skew, the size of each circuit block, operating frequency, consumed power, and wiring delay time between respective circuit blocks.

14. A design support system for a semiconductor integrated circuit comprising an assemblage of a plurality of circuit blocks, the system comprising:

means for inputting a technology parameter for a circuit element and a wiring material constituting each circuit for each circuit block;

means for inputting a circuit parameter for determining a circuit scale of each circuit block;

means for inputting a clock parameter for a clock buffer that is inserted into a transmission line between a clock supply source and each circuit block for receiving the clock supply;

means for calculating the size of each circuit block, operating frequency, and consumed power by using parameters input in said process and calculating wiring delay time between respective circuit blocks based on the size of each circuit block; and means for outputting and displaying said calculations.

15. A computer-readable medium on which is stored a computer program for supporting design of a semiconductor integrated circuit, comprising an assemblage of a plurality of circuit blocks, the computer program comprising instructions which, when executed, perform the steps of:

accepting a technology parameter concerning a circuit element and a wiring material constituting each circuit for each circuit block;

accepting a circuit parameter for determining a circuit scale of each circuit block;

accepting a clock parameter for a clock buffer that is inserted into a transmission line between a clock supply source and each circuit block for receiving the clock supply;

performing at least one of the following processes: calculation of a clock skew of each circuit block, size of each circuit block, an operating frequency and consumed power by using parameters accepted in each of said steps; and outputting said calculations.

16. The computer-readable medium according to claim 15 wherein said technology parameter includes gate length of said circuit element, gate length versus gate width ration, power source voltage, threshold value voltage of said positive element, wiring resistance and a capacity per unit length, a wiring layer number, wiring pitch, and a wiring efficiency value.

17. The computer-readable medium according to claim 15 wherein said circuit parameter includes number of the circuit element, step number of the circuit element, average gate fanout, and Lenz's index.

18. The computer-readable medium according to claim 15 wherein said clock parameter includes a branch number per each step of the clock buffer, a number of flip-flops connected to said clock buffer on a final stage, and a change rate of wiring length between said clock buffers.

19. A computer-readable medium on which is stored a computer program for supporting design of a semiconductor integrated circuit, comprising an assemblage of a plurality of circuit blocks, the computer program comprising instructions which, when executed, perform the steps of:

accepting a technology parameter concerning a circuit element and a wiring material constituting each circuit for each circuit block;

accepting a circuit parameter for determining a circuit scale of each circuit block;

accepting a clock parameter for a clock buffer that is inserted into a transmission line between a clock supply source and each circuit block for receiving the clock supply;

performing at least one of the following processes: calculation of a clock skew of each circuit block, size of each circuit block, an operating frequency and consumed power by using parameters accepted in each of said steps;

calculating wiring delay time between respective circuit blocks based on the size of each circuit block; and outputting said calculations.

* * * * *

UNITED STATES PATENT AND TRADEMARK OFFICE
CERTIFICATE OF CORRECTION

PATENT NO. : 6,253,358 B1
DATED : June 26, 2001
INVENTOR(S) : Takahashi, Shuji

It is certified that error appears in the above-identified patent and that said Letters Patent is hereby corrected as shown below:

Column 4,
Line 65, delete "$V_{TM}$" insert -- $V_{TH}$ --

Column 6,
Line 48, delete "$f_o = D_c/N_{cn}$" insert -- $f_o = D_c/N_{cb}$ --

Signed and Sealed this

Twelfth Day of March, 2002

Attest:

JAMES E. ROGAN
Attesting Officer          Director of the United States Patent and Trademark Office